(12) United States Patent
Lee et al.

(10) Patent No.: US 6,297,070 B1
(45) Date of Patent: *Oct. 2, 2001

(54) ACTIVE PIXEL SENSOR INTEGRATED WITH A PINNED PHOTODIODE

(75) Inventors: Paul P. Lee, Pittsford; Robert M. Guidash, Rush; Teh-Hsuang Lee, Webster; Eric Gordon Stevens, Rochester, all of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/436,371

(22) Filed: Nov. 8, 1999

Related U.S. Application Data

(62) Division of application No. 08/771,122, filed on Dec. 20, 1996, now Pat. No. 6,027,955.

(51) Int. Cl.⁷ .................................................. H01L 21/18
(52) U.S. Cl. .................................................. 438/57
(58) Field of Search ................... 438/57, 73, 78, 438/59, 60, 210, 237, 91, 200, 514, 527; 257/291, 292, 290, 232, 233, 369

(56) References Cited

U.S. PATENT DOCUMENTS

| | | | |
|---|---|---|---|
| 4,333,111 | 6/1982 | Noda et al. | 358/213 |
| 4,388,532 | 6/1983 | Garcia | 250/578 |
| 4,413,284 | 11/1983 | Izumita et al. | 358/213 |
| 4,484,210 | 11/1984 | Shiraki et al. | 357/24 |

(List continued on next page.)

FOREIGN PATENT DOCUMENTS

| | | | |
|---|---|---|---|
| 61-125081 | 6/1986 | (JP) | H01L/29/76 |
| 62-160750 | 7/1987 | (JP) | H01L/27/04 |
| 63-299268 | 12/1988 | (JP) | H01L/27/14 |
| 1-135184 | 5/1989 | (JP) | H04N/5/335 |
| 1-243462 | 9/1989 | (JP) | H01L/27/14 |
| 3-161964 | 7/1991 | (JP) | H01L/27/06 |

OTHER PUBLICATIONS

"CMOS Active Pixel Image Sensor" by Mendis et al., *IEEE Transactions On Electron Devices*, vol. 41, No. 3, Mar. 1994, pp. 452–453.

"The Pinned Photodiode For An Interline–Transfer CCD Image Sensor" by B. C. Burkey et al., *IEDM 84*, 1984, pp. 28–31.

"A ¼ Inch 330k Square Pixel Progressive Scan CMOS Acitve Pixel Image Sensor", by Eiji Oba et al., *1997 IEEE International Solid–State Circuits Conference*, pp. 180–189 and pp. 452–454.

"An 800K–Pixel Color CMOS Sensor For Consumer Still Cameras", by J.E.D. Hurwitz et al., *VLSI Vision Ltd.*, Aviation House, 31 Pinkhill, Edinburgh.

(List continued on next page.)

*Primary Examiner*—Savitri Mulpuri
(74) *Attorney, Agent, or Firm*—Peyton C. Watkins

(57) ABSTRACT

The optimization of two technologies (CMOS and CCD) wherein a pinned photodiode is integrated into the image sensing element of an active pixel sensor. Pinned photodiodes are fabricated with CCD process steps into the active pixel architecture. Charge integrated within the active pixel pinned photodiode is transferred into the charge sensing node by a transfer gate. The floating diffusion is coupled CMOS circuitry that can provide the addressing capabilities of individual pixels. Alternatively, a buried channel photocapacitor can be used in place of the pinned photodiode.

2 Claims, 4 Drawing Sheets

U.S. PATENT DOCUMENTS

| | | | |
|---|---|---|---|
| 4,686,373 | 8/1987 | Tew et al. | 250/578 |
| 4,809,075 | 2/1989 | Akimoto et al. | 358/213.18 |
| 4,908,518 | 3/1990 | Losee et al. | 358/213.23 |
| 4,984,047 | 1/1991 | Stevens | 357/30 |
| 5,021,663 | 6/1991 | Hornbeck | 250/349 |
| 5,051,797 | 9/1991 | Erhardt | 357/24 |
| 5,060,245 | 10/1991 | Nelson | 377/60 |
| 5,115,458 | 5/1992 | Burkey et al. | 377/58 |
| 5,182,623 | 1/1993 | Hynecek | 257/230 |
| 5,192,990 | 3/1993 | Stevens | 257/229 |
| 5,202,907 | 4/1993 | Yonemoto | 377/60 |
| 5,235,196 | 8/1993 | Anagnostopoulos et al. | 257/223 |
| 5,235,198 | 8/1993 | Stevens et al. | 257/232 |
| 5,256,891 | 10/1993 | Losee et al. | 257/233 |
| 5,262,871 | 11/1993 | Wilder et al. | 358/213.11 |
| 5,306,931 | 4/1994 | Stevens | 257/223 |
| 5,337,340 | 8/1994 | Hynecek | 377/60 |
| 5,359,213 | 10/1994 | Lee et al. | 257/223 |
| 5,369,039 | 11/1994 | Hynecek | 437/2 |
| 5,389,833 | 2/1995 | Kay | 327/96 |
| 5,399,889 | 3/1995 | Miyake et al. | 257/292 |
| 5,454,022 | 9/1995 | Lee et al. | 378/98.8 |
| 5,471,515 | 11/1995 | Fossum et al. | 377/60 |
| 5,587,596 | 12/1996 | Chi et al. | 257/223 |
| 5,608,243 | 3/1997 | Chi et al. | 257/249 |
| 5,625,210 | 4/1997 | Lee et al. | 257/292 |
| 5,835,141 | 11/1998 | Ackland et al. | 348/308 |
| 5,841,159 | 11/1998 | Lee et al. | 257/291 |
| 5,854,100 | 12/1998 | Chi | 438/202 |

OTHER PUBLICATIONS

"A 250,000–Pixel Image Sensor With FET Amplification at Each Pixel for High–Speed Television Cameras", by Fumihiko Andoh et al., Feb. 16, 1990, *1990 IEEE International Solid–State Circuit Conference*, pp. 212–213 and p. 298.

A Small Pixel CMD Image Sensor, by Masanori Ogata et al., *IEEE Transactions on Electron Devices*, vol. 38, No. 5, May 1991, pp. 1005–1010.

"Technology and Device Scaling Considerations For CMOS Imagers", by Hon–Sum Wong, *IEEE Transactions On Electron Devices*, vol. 43, No. 12, Dec. 1996, pp. 2131–2142.

"Active Pixel SensorsL Are CCD's Dinosaurs?", by Eric R. Fossum, *SPIE*, vol. 1900, pp. 2–14.

"128+128 CMOS Photodiode–Type Active Pixel Sensor With On–Chip Timing, Control and Signal Chain Electronics", by R. H. Nixon et al., *Proceedings of the SPIE*, vol. 2415, "Charge–Coupled Devices and Solid–State Optical Sensors V", paper 34 (1995), pp. 1–7.

"The Operation Mechanism of a Charge Modulation Device (CMD) Image Sensor", by Kazuya Matsumoto et al., *IEEE Transactions On Electron Devices*, vol. 38, No. 5, May 1991, pp. 989–998.

Analysis of Operational Speed and Scaling Down the Pixel Size of a Charge Modulation Device (CMD) Image Sensor, by Kazuya Matsumoto et al., *IEEE Transactions on Electron Devices*, vol. 38, No. 5, May 1991, pp. 999–1004.

"A Small Pixel CMD Image Sensor", by Masanori Ogata et al., *IEEE Transactions On Electron Devices*, vol. 38, No. 5, May 1991, pp. 1005–1010.

"BCMD–An Improved Photosite Structure for High–Density Image Sensors", by Jaroslav Hynecek, *IEEE Transactions On Electron Devices*, vol. 38, No. 5, May 1991, pp. 1011–1020.

"A 250 k–Pixel SIT Image Sensor Operating in its High–Sensitivity Mode", by Toyokazu Mizoguchi et al., *IEEE Transactions On Electron Devices*, vol. 38, No. 5, May 1991, pp. 1021–1027.

"Design of Bipolar Imaging Device (BASIS)", by Yoshio Nakamura et al., *IEEE Transactions On Electron Devices*, vol. 38, No. 5, May 1991, pp. 1028–1036.

Reduction of Fixed–Pattern Noise of BASIS Due to Low Kinetic Energy Reactive Ion and Native–Oxide–Free Processing, by Mamoru Miyawaki et al., *IEEE Transactions On Electron Devices*, vol. 38, No. 5, May 1991, pp. 1037–1043.

"A HIgh–Sensitivity MOS Photo–Transistor for Area Image Sensor", by Yoshiyuki Matsunaga et al., *IEEE Transactions On Electron Devices*, vol. 38, No. 5, May 1991, pp. 1044–1047.

"Amplifying Solid–State Image Pickup Element AMI (Amplified MOS Intelligent Imager)", by Fumihiko Ando et al.,*Special Edition: Solid–State Image Pickup Technology*, vol. 41, No. 11, 1987, pp. 1075–1082 (translated pp. 1–33).

"An Active Pixel Sensor Fabricated Using CMOS/CCD Processing Technology", by Paul P. K. Lee et al., *Presented at the 1995 IEEE Workshop on Charged–Coupled Devices and Advanced Image Sensors, Apr. 20–22, 1995, Dana Point, CA*, pp. 1–5.

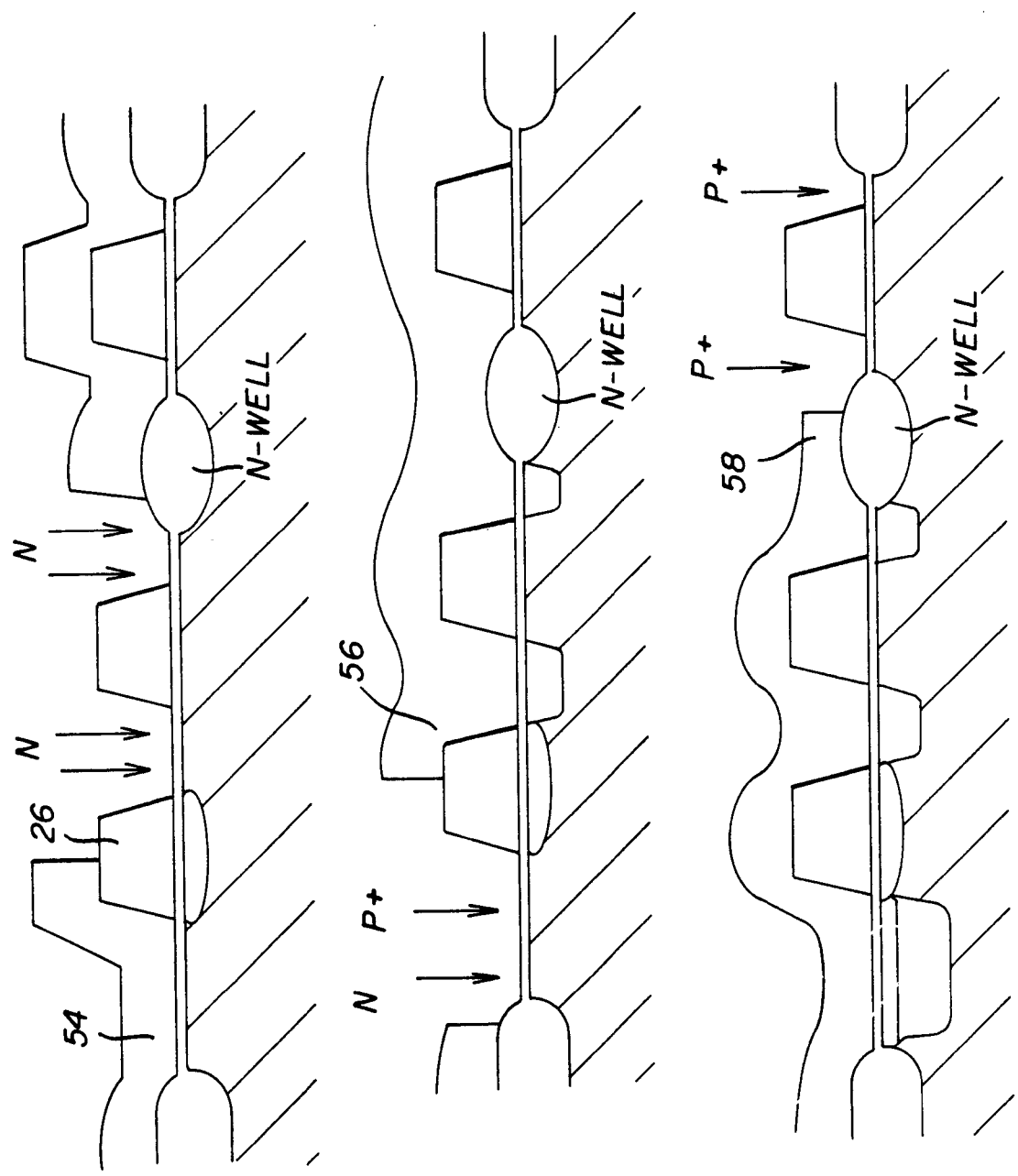

ACTIVE PIXEL SENSOR INTEGRATED WITH A PINNED PHOTODIODE

CROSS REFERENCE TO RELATED APPLICATIONS

This is a divisional application of application Ser. No. 08/771,122, filed Dec. 20, 1996, now U.S. Pat. No. 6,027,955.

FIELD OF THE INVENTION

The present invention relates to image sensing devices, and more particularly, to the integration of pinned photodiode technology within CMOS technology.

BACKGROUND OF THE INVENTION

Active pixel sensors refer to electronic image sensors within active devices, such as transistors, that are associated with each pixel. An active pixel sensor has the advantage of being able to easily incorporate signal processing and decision making circuitry on the same chip. Conventional active pixel sensors typically employ polysilicon photocapacitors or photodiodes as the active image sensing elements. These conventional active pixel sensors suffer from poor blue color response, high dark current and image lag.

Pinned photodiodes have been employed within charge coupled devices and have shown advantages in the area of color response for blue light, dark current density and image lag. For this reason pinned photodiodes are normally associated with high performance image sensors. Heretofore, pinned photodiodes have typically been employed as photoelements for charge coupled devices. An example of such a use of a pinned photodiode can be seen in THE PINNED PHOTODIODE FOR AN INTERLINE-TRANSFER CCD IMAGE SENSOR, by Burkey et al., IEDM 84, 1984, pages 28–31. However, charge coupled device technology lacks in the amount and type of circuitry elements that can be placed on a device.

From the foregoing discussion it should be apparent that there remains a need within the art of semiconductors for a pinned photodiode employed within a semiconductor technology that can provide advanced circuitry elements.

SUMMARY OF THE INVENTION

The present invention overcomes the shortcomings of the prior art by providing for the optimization of two technologies (CMOS and CCD) wherein a pinned photodiode is integrated into the image sensing element of an active pixel sensor. Pinned photodiodes are normally fabricated with CCD technology. By incorporating the appropriate process steps a pinned photodiode can be integrated into the active pixel architecture. To improve the blue response and the dark current limitations of the active pixel sensor, a new CMOS imager has been integrated with a pinned photodiode using a mixed process technology. This technology combines CMOS and CCD processes to provide the best features from both technologies.

BRIEF DESCRIPTION OF THE DRAWING

FIG. 3a through FIG. 3g illustrate the various process steps employed in creating the device of FIG. 2.

DESCRIPTION OF THE PREFERRED EMBODIMENT

It has been discovered that technological features of a charge coupled device (CCD) can be employed to CMOS type semiconductors to create an active pixel sensor having a pinned photodiode.

Figure 1:
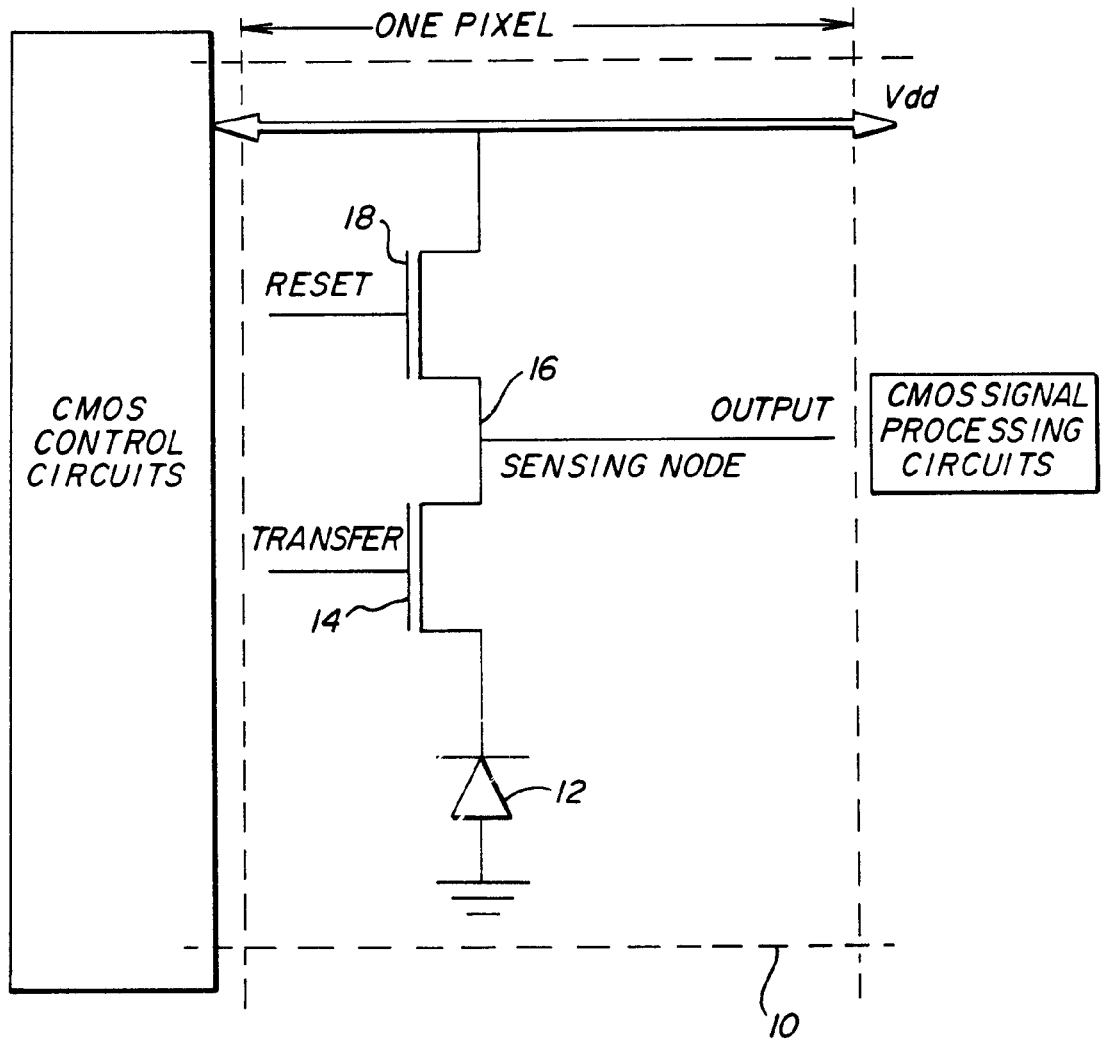
FIG. 1 is a schematic diagram of the pinned photodiode based active pixel sensor of the present invention.

FIG. 1 shows a schematic diagram of the pinned photodiode based active pixel sensor of the present invention, as employed within a CMOS based signal processing system. To improve the blue response, reduce lag and minimize the dark current characteristics of the active pixel sensor, a new CMOS imager has been integrated with a pinned photodiode 12 using a mixed process technology. This combines n-well CMOS technology and a pinned photodiode process to provide a sensor having the best features from both technologies. An n x m pinned photodiode active pixel sensor can be designed and fabricated, where n and m are number of pixels on the edges of the sensor. The present invention has advantages by incorporating image-sensor technology in CMOS active sensor.

Figure 2:
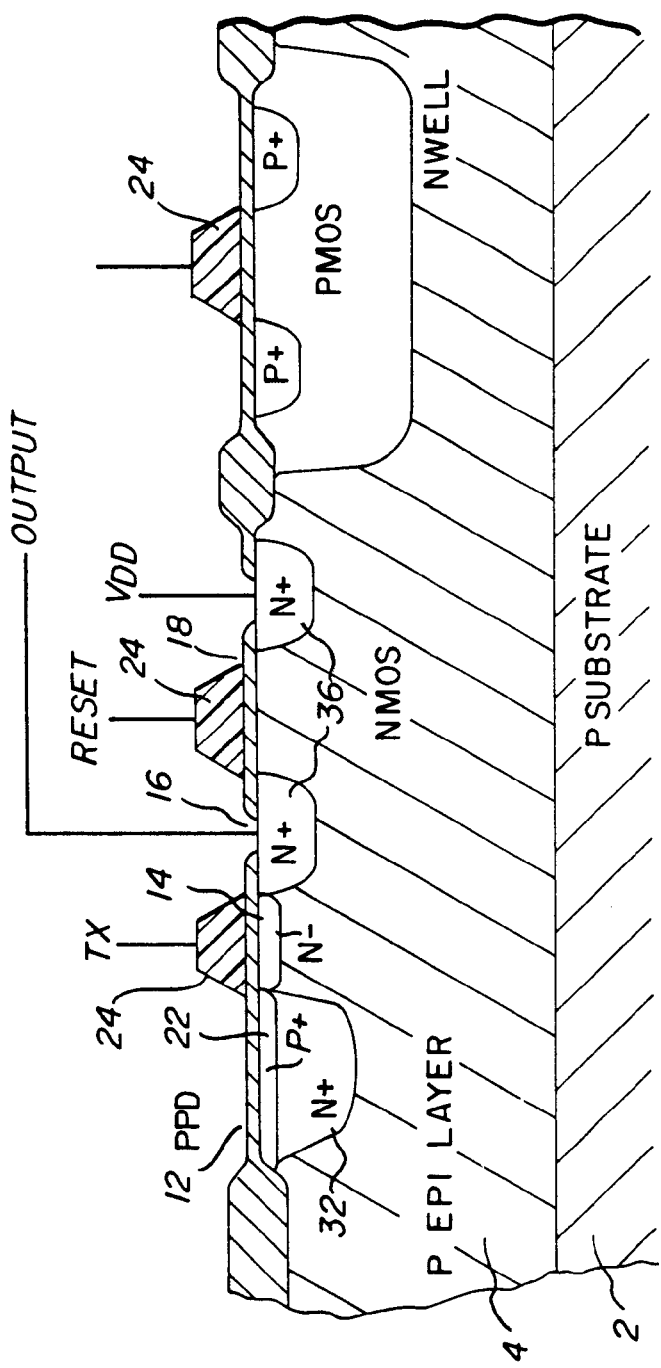
FIG. 2 is a cross sectional diagram of the devices used in creating the sensor of the present invention.

FIG. 2 illustrates a cross sectional diagram of the devices used in creating the sensor of the present invention. This is the result of integration of an active pixel sensor (APS) architecture typically fabricated in Complementary Metal Oxide Semiconductor (CMOS) technology with a pinned photodiode 12 (PPD) device using a mixed process technology. This new technology allows mixing of CMOS and high performance Charge-Coupled Device (CCD) modules. The PPD 12 becomes the photoactive element in an XY-addressable area array with each pixel containing active devices for the transfer gate 14, readout via floating diffusion 16, and reset 18 functions. An n-well CMOS technology was combined with the CCD process to provide the best features from both technologies. By replacing the polysilicon photocapacitor or photogate in conventional APS with the pinned photodiode 12, deficiencies in poor blue response, image lag and high dark current are minimized.

A buried-channel photocapacitor (not shown) biased in the accumulation mode would not have the limitations in dark current that CMOS technology has. A buried channel photcapacitor has essentially equivalent dark current characteristics to the PPD. The blue response problem can also be eliminated by using transparent gating material. An example of such a material would be Indium Tin Oxide (ITO). Therefore, employing both a buried channel photocapacitor with a transparent gate electrode provides for superior characteristics for blue light response and dark current, similar to those achieved by the PPD. Both the buried channel photocapacitor with a transparent gate and the PPD are devices typically associated with CCD technology. The present invention incorporates these devices from the CCD technology with CMOS processing capabilities. The construction of a active pixel sensor employing a buried channel photcapacitor would be similar to the PPD in FIG. 2 with the photocapacitor structured much like the transfer gate of the PPD embodiment. The transfer gate of the photocapacitor embodiment then would be without the buried channel of the transfer gate used by the PPD embodiment.

The process integration mixes the two technologies resulting in performance which is comparable to that obtained by each of the conventional processes, individually. This was demonstrated on linear image sensors and CMOS test circuits.

In the mixed process technology, schematic representation of the process flow is given in FIGS. 3a through 3g.

Figure 3A:
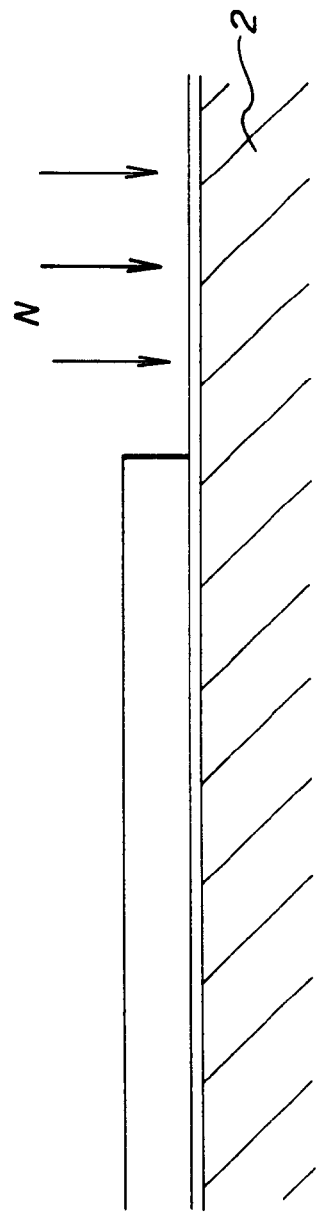

FIG. 3a illustrates the patterning and ion implantation used within the present invention to form n-well 40 which is used to contain the PMOS transistors that will form part of the control circuits of present invention.

Figure 3B:
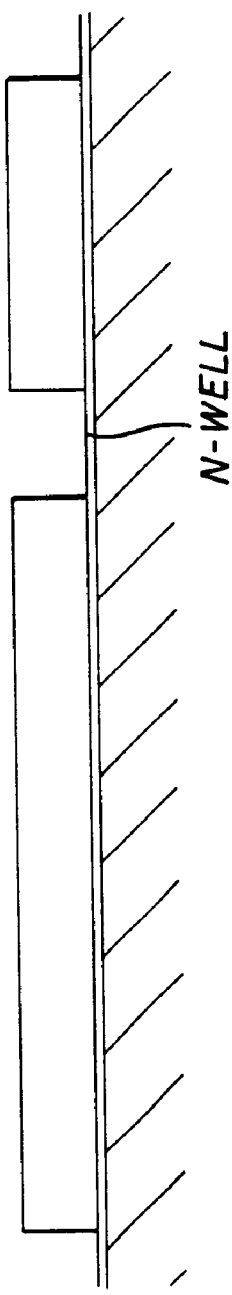
Figure 3C:
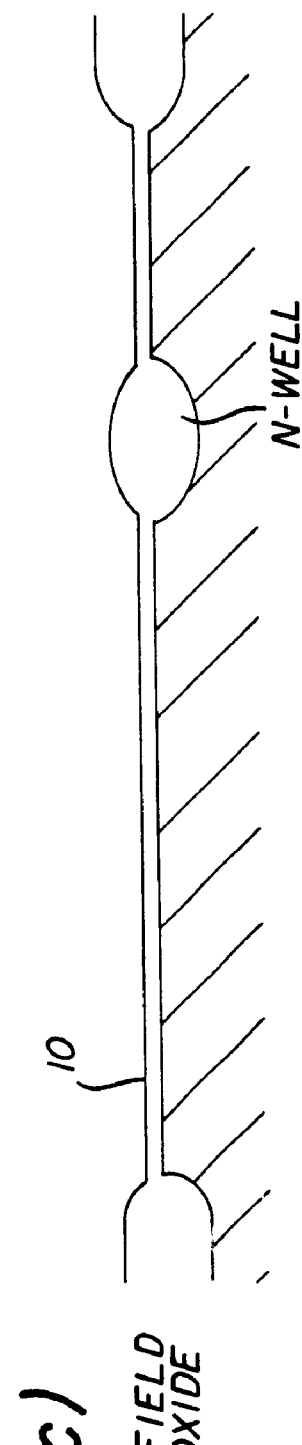

FIGS. 3b and 3c show the patterning and growth of isolation oxide/field oxide which is used for isolating devices to be formed on the silicon layer 2 with or without epitaxial layers and with or without wells structures.

Figure 3D:
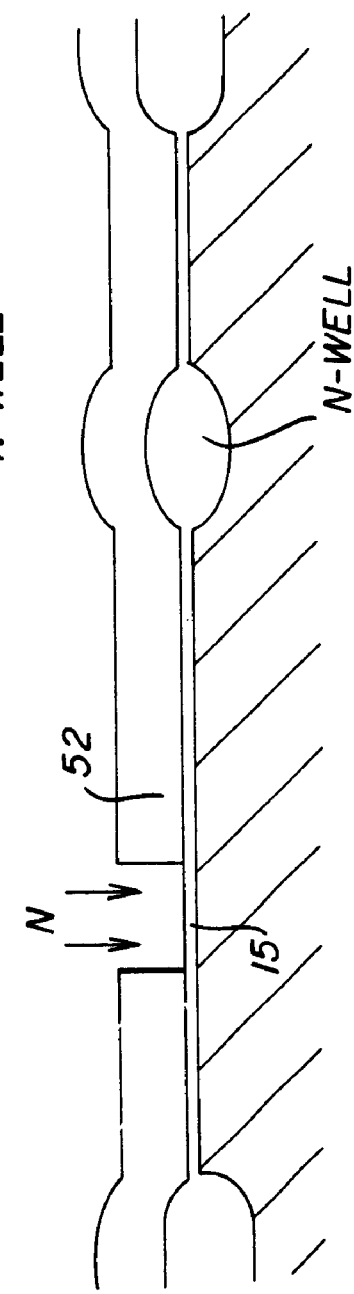

FIG. 3d illustrates the patterning and ion implantation of an n-type buried channel 15 which is used to form the transfer gate 14 of the pixel within the present invention. After the implantation of the buried channel 15, photoresist layer 52 is removed and a polysilicon layer 26 is formed upon the substrate. The polysilicon 26 is used to form local interconnects and the gates of transistors. Both PMOS and NMOS transistors will have their gates formed by this polysilicon 26.

FIG. 3e shows the patterning of the polysilicon 26 with photoresist 54 and implantation of N+ dopant to form source and drain regions. This results in source and drain regions that are self aligned to the remaining polysilicon 26. This forms the NMOS transistors within the preferred embodiment.

FIG. 3f show the construction of the PPD by patterning with photoresist 56 areas for two additional implants. The first implant is to create a photodiode by implanting a deeper N+ impurity than was previously used by the source and drain implants discussed above. The deeper implant yields substantial increases in photo response due to an increase collection path for the incident photo carriers with the deeper implant. A pinning layer 22 implant is then made using high doses of low energy P+ dopant that remains near the surface of the photodiode 32.

FIG. 3g shows the patterning with photoresist 58 and the following ion implantation of the source/drains of the PMOS transistors. As with the NMOS transistors, the source/drain implants for the PMOS transistors are self aligned with the selected polysilicon. P+ implant are used to construct the PMOS transistors.

The device is completed by the appropriate planarization and metalization steps.

The imager architecture of the present invention can be employed to signal processing circuitry of prior art devices to increase their overall performance. An example is the incorporation of the present invention into an earlier designs implemented at Jet Propulsion Laboratory. This earlier design is described in IEEE Transactions on Electron Devices, Vol. 41, No. 3, March 1994 (hereinafter referred to as JPL). While describing a photogate integrated into an active pixel sensor, the device as taught by JPL did not provide a sensor that yielded satisfactory blue wavelength color response. Additionally, the JPL device lacked sufficient low dark current noise characteristics. The present invention overcomes these shortcomings by incorporating pinned photodiode technology not conventionally applied within CMOS technology. This results in an image sensor having superior response for blue light and improved dark current noise characteristics.

While the best mode known to the inventor has been disclosed by the preferred embodiment, various modifications will be obvious to those skilled in the art. These obvious modifications should be considered in view of the appended claims.

Parts List
2 substrate
4 epitaxial layer
10 pixel
12 photodiode
14 transfer
15 channel
16 diffusion
18 reset
22 pinning layer
26 polysilicon
32 photodiode
40 n-well
52 photoresist layer
54 photoresist
56 photoresist
58 photoresist

What is claimed is:

1. A method of forming an active pixel sensor comprising the steps of:

providing a semiconductor substrate of a first conductivity type with an array of pixels on it; and providing at least one pixel with a pinned photodiode having a pinning layer heavily doped of the first conductivity type and a photodiode heavily doped of a second conductivity type and at a depth deeper than source and drain regions of CMOS within the array of pixels that is operatively coupled to a sensing node conpised of a floating diffusion connected to a CMOS control circuitry through a transfer gate controlled by said CMOS control circuitry, the at least one pixel further comprising means for transferring charge from the pinned photodiode to a floating diffusion area under control of a transfer gate for charge to voltage conversion within the pixel such that the pinned photodiode, the transfer gate and a charge sensing means acts as, respectively, the source, the gate and the drain of a MOSFET.

2. The method of claim 1 wherein the CMOS control circuitry is operatively coupled to an array of pinned photodiodes.

* * * * *